(12) United States Patent
Morse et al.

(10) Patent No.: US 10,727,034 B2
(45) Date of Patent: Jul. 28, 2020

(54) MAGNETIC FORCE RELEASE FOR SPUTTERING SOURCES WITH MAGNETIC TARGET MATERIALS

(71) Applicant: Sputtering Components, Inc., Owatonna, MN (US)

(72) Inventors: Patrick Lawrence Morse, Tucson, AZ (US); Daniel Theodore Crowley, Owatonna, MN (US)

(73) Assignee: Sputtering Components, Inc., Owatonna, MN (US)

( * ) Notice: Subject to any disclaimer, the term of this patent is extended or adjusted under 35 U.S.C. 154(b) by 351 days.

(21) Appl. No.: 15/678,962

(22) Filed: Aug. 16, 2017

(65) Prior Publication Data
US 2019/0057848 A1     Feb. 21, 2019

(51) Int. Cl.
*C23C 14/34*  (2006.01)
*H01J 37/34*  (2006.01)
*H01F 7/02*  (2006.01)

(52) U.S. Cl.
CPC ........ *H01J 37/3455* (2013.01); *H01F 7/0252* (2013.01); *H01J 37/342* (2013.01); *H01J 2237/002* (2013.01)

(58) Field of Classification Search
CPC ........................... H01J 37/342; H01J 37/3455
See application file for complete search history.

(56) References Cited

U.S. PATENT DOCUMENTS

| 2009/0078571 A1 | 3/2009 | Abarra et al. |
| 2011/0062022 A1 | 3/2011 | Goderis et al. |
| 2012/0175251 A1 | 7/2012 | Crowley et al. |

(Continued)

FOREIGN PATENT DOCUMENTS

| JP | H06262032 A | 9/1994 |
| JP | 1161403 A | 3/1999 |

OTHER PUBLICATIONS

International Searching Authority, "International Search Report and Written Opinion from PCT Application PCT/US2018/042318 dated Nov. 29, 2018", from Foreign Counterpart to U.S. Appl. No. 15/678,962, pp. 1-11, Published: WO.

(Continued)

*Primary Examiner* — Jason Berman
(74) *Attorney, Agent, or Firm* — Fogg & Powers LLC

(57) ABSTRACT

A magnet bar assembly for a rotary target cathode comprises a support structure, a magnet bar structure movably attached to the support structure and including a plurality of magnets, and a positioning mechanism operatively coupled to the support structure and the magnet bar structure. The positioning mechanism is configured to move the magnet bar structure between a retracted position and a deployed position while inside a magnetic target material cylinder. The retracted position substantially reduces a magnetic force between the magnets and a magnetic target material of a target cylinder when the magnet bar assembly is inserted into the target cylinder or removed from the target cylinder. The deployed position substantially increases the magnetic force between the magnets and the magnetic target material when the magnet bar assembly is in the target cylinder, and allows a magnetic field from the magnet bar structure to penetrate through the magnetic target material.

10 Claims, 15 Drawing Sheets

(56) References Cited

U.S. PATENT DOCUMENTS

2015/0235821 A1* 8/2015 Madocks ............ H01J 37/3435
   204/298.12
2016/0225591 A1* 8/2016 Crowley ............. H01J 37/3444

OTHER PUBLICATIONS

International Bureau, "International Preliminary Report on Patentability from PCT Application No. PCT/US2018/042318", from Foreign Counterpart to U.S. Appl. No. 15/678,962, dated Feb. 27, 2020, pp. 1-8, Published: WO.

* cited by examiner

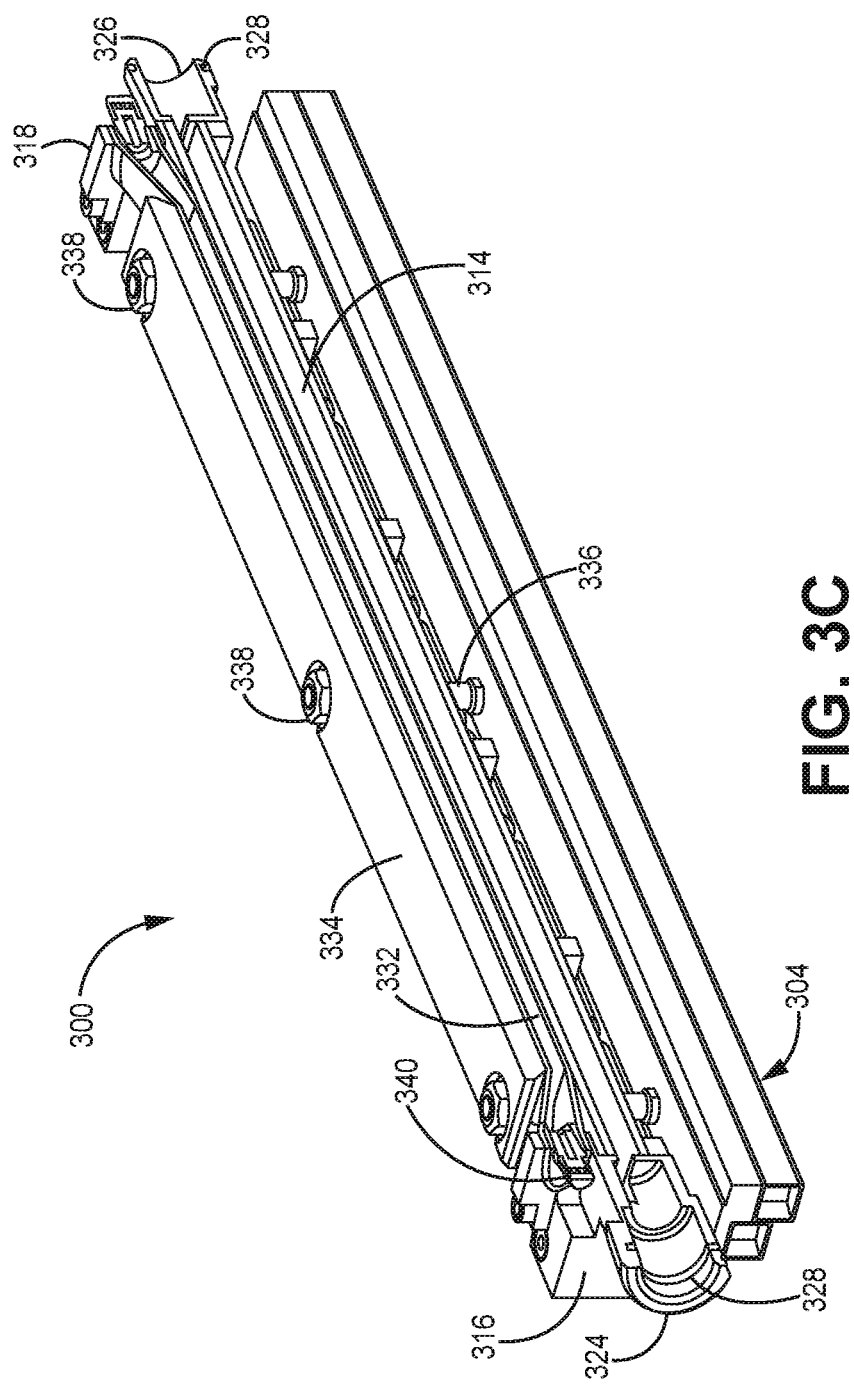

MAGNETIC FORCE RELEASE FOR SPUTTERING SOURCES WITH MAGNETIC TARGET MATERIALS

BACKGROUND

A sputtering apparatus typically includes a target tube that includes a magnetic target material, and a magnet bar that is inserted into the target tube. The magnetic properties of the magnetic target material cause an attractive force between the target material and the magnet bar. This attractive force is large enough to create a substantial force between an inner surface of the target tube and the magnet bar, which makes insertion and removal of the magnet bar into and from the target tube difficult.

SUMMARY

A magnet bar assembly for a rotary target cathode comprises a support structure, a magnet bar structure movably attached to the support structure and including a plurality of magnets, and a positioning mechanism operatively coupled to the support structure and the magnet bar structure. The positioning mechanism is configured to move the magnet bar structure between a retracted position and a deployed position. The retracted position of the magnet bar structure substantially reduces a magnetic force between the magnets and a magnetic target material of a target cylinder when the magnet bar assembly is inserted into the target cylinder or removed from the target cylinder. The deployed position of the magnet bar structure substantially increases the magnetic force between the magnets and the magnetic target material when the magnet bar assembly is in the target cylinder, and allows a magnetic field from the magnet bar structure to penetrate through the magnetic target material.

BRIEF DESCRIPTION OF DRAWINGS

FIG. 3C is a cross-sectional side perspective view of the magnet bar assembly of FIG. 3A, in a deployed position;

DETAILED DESCRIPTION

Figure 1A:
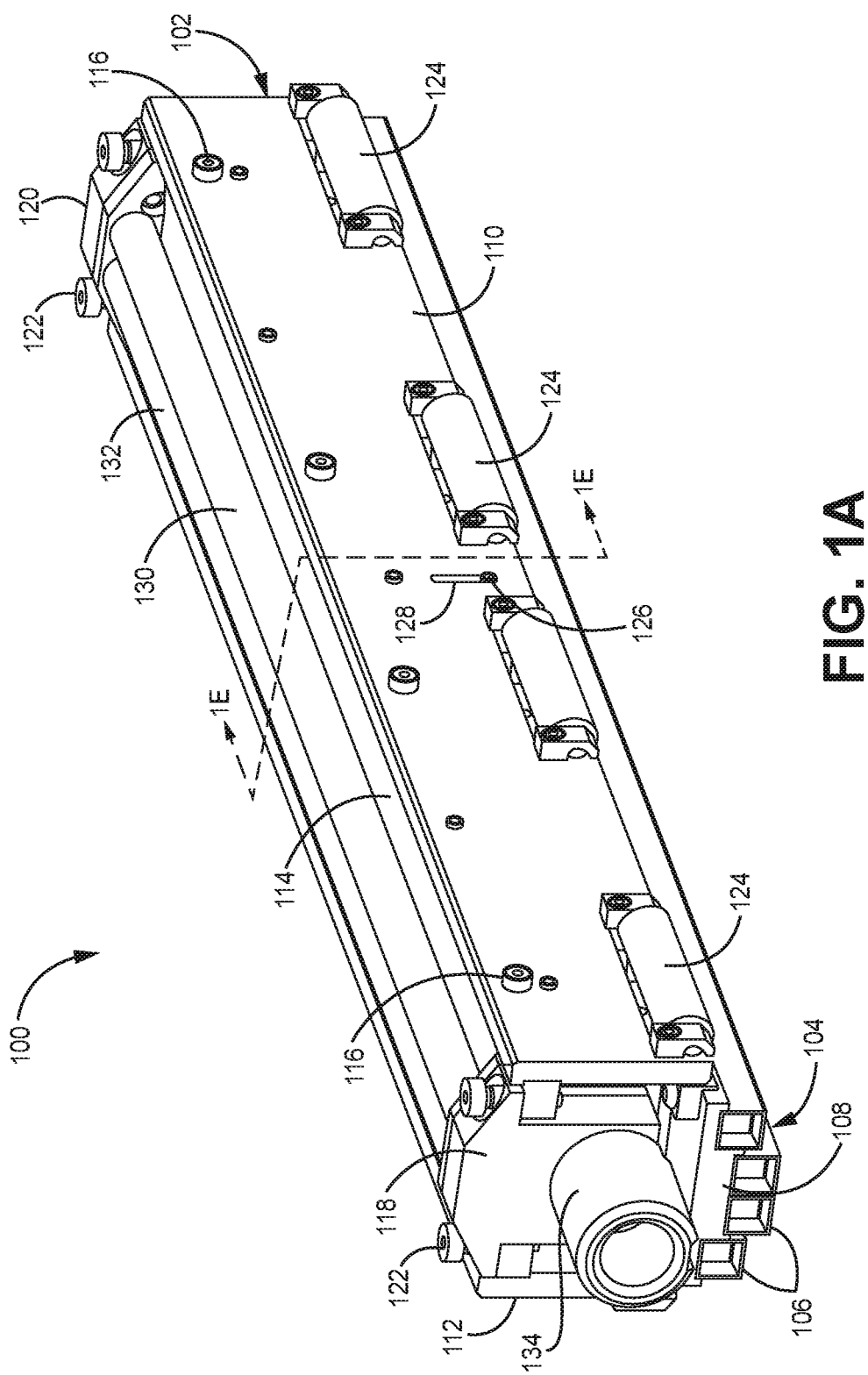
FIG. 1A is a perspective view of a magnet bar assembly for a rotary target cathode, according to one embodiment.

Various apparatus and methods to provide magnetic force release for sputtering sources with magnetic target materials are disclosed and described herein. The present techniques provide mechanisms for retracting magnets of a magnet bar away from magnetic target materials, allowing for easy insertion and removal of the magnet bar into and from a target cylinder of a rotary target cathode.

Alternative positioning mechanisms are provided to move the magnet bar relative to the magnetic target material, such that when the magnet bar is a retracted position, which reduces the magnetic force between the magnet bar and magnetic target material, easy insertion and removal of the magnet bar into and from the target cylinder is enabled. The positioning mechanisms are also operative to move the magnet bar closer to the target cylinder in a deployed position, enabling the magnetic field to penetrate through the target material for a sputtering process to take place on the outside surface of the target cylinder.

The present techniques provide various advantages and benefits. For example, no external magnet bar insertion or removal tool is required to install or remove a fixed magnet bar from a target tube. In addition, no expensive remote-control equipment is required, because the magnet bar is mechanically deployed or retracted while the target cylinder is unmounted to an end block.

The present techniques can be implemented in a magnet bar assembly for a rotary target cathode, with the magnet bar assembly including a magnet bar structure movably attached to a support structure, and a positioning mechanism operatively coupled to the support structure and the magnet bar structure. The positioning mechanism is configured to move the magnet bar structure between a retracted position and a deployed position. The retracted position of the magnet bar structure substantially reduces a magnetic force between the magnet bar structure and a magnetic target material of a target cylinder when the magnet bar assembly is inserted into the target cylinder or removed from the target cylinder. The reduced magnetic force significantly reduces the friction force between the magnet bar assembly and the inner surface of the target cylinder, allowing for easier insertion and removal by an operator.

In some embodiments, when the magnet bar structure is in the deployed position, there is a gap from about 1 mm to about 3 mm between the magnet bar structure and the target cylinder. When the magnet bar structure is moved to the retracted position from the deployed position, the gap between the magnet bar structure and the target cylinder is increased by about 10 mm to about 20 mm.

The support structure of the magnet bar assembly can be substantially rigid in order to accurately limit a distance between the magnet bar structure and the target cylinder when in the deployed position. A coolant pathway can also be provided to allow a coolant supply and return to be located on only one side of the target cylinder.

The deployed position of the magnet bar structure substantially increases the magnetic force between the magnets and the magnetic target material when the magnet bar assembly is in the target cylinder, to allow the magnetic field from the magnet bar structure to penetrate through the magnetic target material. The magnetic field produced on the surface of the magnetic target material, while the magnet bar structure is in the deployed position, needs to be strong enough to magnetically confine the plasma and enable standard magnetically confined sputtering processes. In order to saturate the magnetic target material with enough magnetic field to create the magnetic confinement on the target surface, the strong magnets of the magnet bar structure need to be held close to the target surface, which creates substantially large attractive forces between the magnets and the magnetic target material.

In order to reduce the magnetic force between the magnet bar structure and the magnetic target material, alternative embodiments of the positioning mechanism can be implemented that allows the magnet bar structure to be retracted away from the target cylinder inner surface for insertion and removal. The positioning mechanism is then employed to move the magnet bar structure to the deployed position once the magnet bar is in the correct position within the target cylinder. The positioning of the magnet bar structure can take place while the magnet bar assembly is inside the target cylinder, prior to the target cylinder being mounted to an end block of a rotary target cathode. The positioning of the magnet bar structure to the deployed position can also take place after the target cylinder has been mounted to an end block of a rotary target cathode. The positioning can be made with any combination of mechanical, electrical, pneumatic, hydraulic, or magnetic forces. The positioning mechanism is configured to provide either a fully deployed or a fully retracted position of the magnet bar structure.

One or more adjustment mechanisms can be provided, in addition to the positioning mechanism, for magnetic field fine tuning while the magnet bar structure is outside of the target cylinder. For example, the adjustment mechanisms can provide individual adjustments along the length of the support structure, while the magnet bar assembly is outside of the target cylinder, to provide for tuning of magnetic field uniformity on a surface of the target cylinder.

In one embodiment, the positioning mechanism is provided by a mechanical linkage assembly. In another embodiment, the positioning mechanism is provided by a rubber spring and inflatable bladder assembly. In a further embodiment, the positioning mechanism is provided by an inflatable bladder without the springs.

In an alternative embodiment, a magnet bar assembly for a rotary target cathode comprises a support structure, a magnet bar structure attached to the support structure, and a magnetic force strain relief assembly. The strain relief assembly includes a strain relieved end block connection coupled to the support structure at a first end, and a strain relieved end cap connection coupled to the support structure at a second end opposite from the first end. The strain relief assembly prevents the magnetic force between the magnet bar assembly and a magnetic target cylinder from transferring to the end block connection and the end cap connection.

Various exemplary embodiments are described as follows with reference to the drawings.

FIGS. 1A-1E illustrate various views of a magnet bar assembly 100 for a rotary target cathode, according to one embodiment. In general, magnet bar assembly 100 includes a rigid elongated support structure 102, and a magnet bar structure 104 movably attached to support structure 102. The magnet bar structure 104 includes an array of substantially parallel rows of magnets 106 attached to a yoke 108. The magnet bar structure 104 is movable between a retracted position (FIGS. 1B and 1D) and a deployed position (FIGS. 1C and 1E) using a positioning mechanism, which is described hereafter. The positioning mechanism is configured to move magnet bar structure 104 relative to an inner surface of a rotatable target cylinder, such that magnet bar structure 104 is movable between the retracted position and the deployed position.

The support structure 102 includes a pair of opposing side plates 110, 112 and a top plate 114 coupled between side plates 110, 112, such as with a set of bolts 116. A pair of opposing end plates 118, 120 are each movably coupled to top plate 114, such as with a set of bolts 122. A plurality of rollers 124 are movably connected to side plates 110, 112. The rollers 124 are configured to hold magnet bar structure 104 away from an inner surface of the target cylinder during operation of the rotary target cathode. A travel limiting guide pin 126 is located in a slot 128 of side plate 110 and is operative to keep magnet bar structure 104 correctly positioned.

Figure 1B:
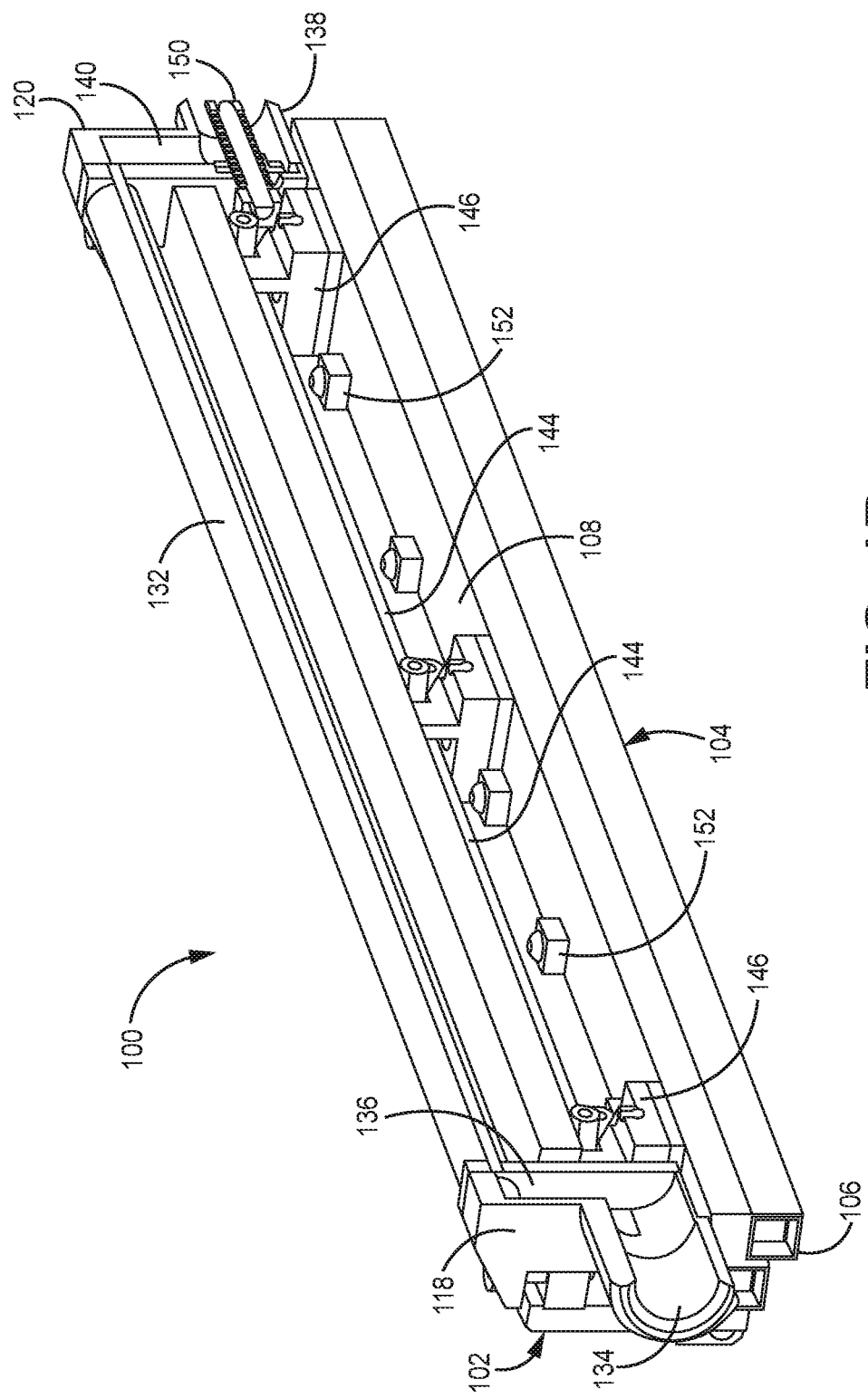
FIG. 1B is a cross-sectional side perspective view of the magnet bar assembly of FIG. 1A, in a retracted position.
Figure 1C:
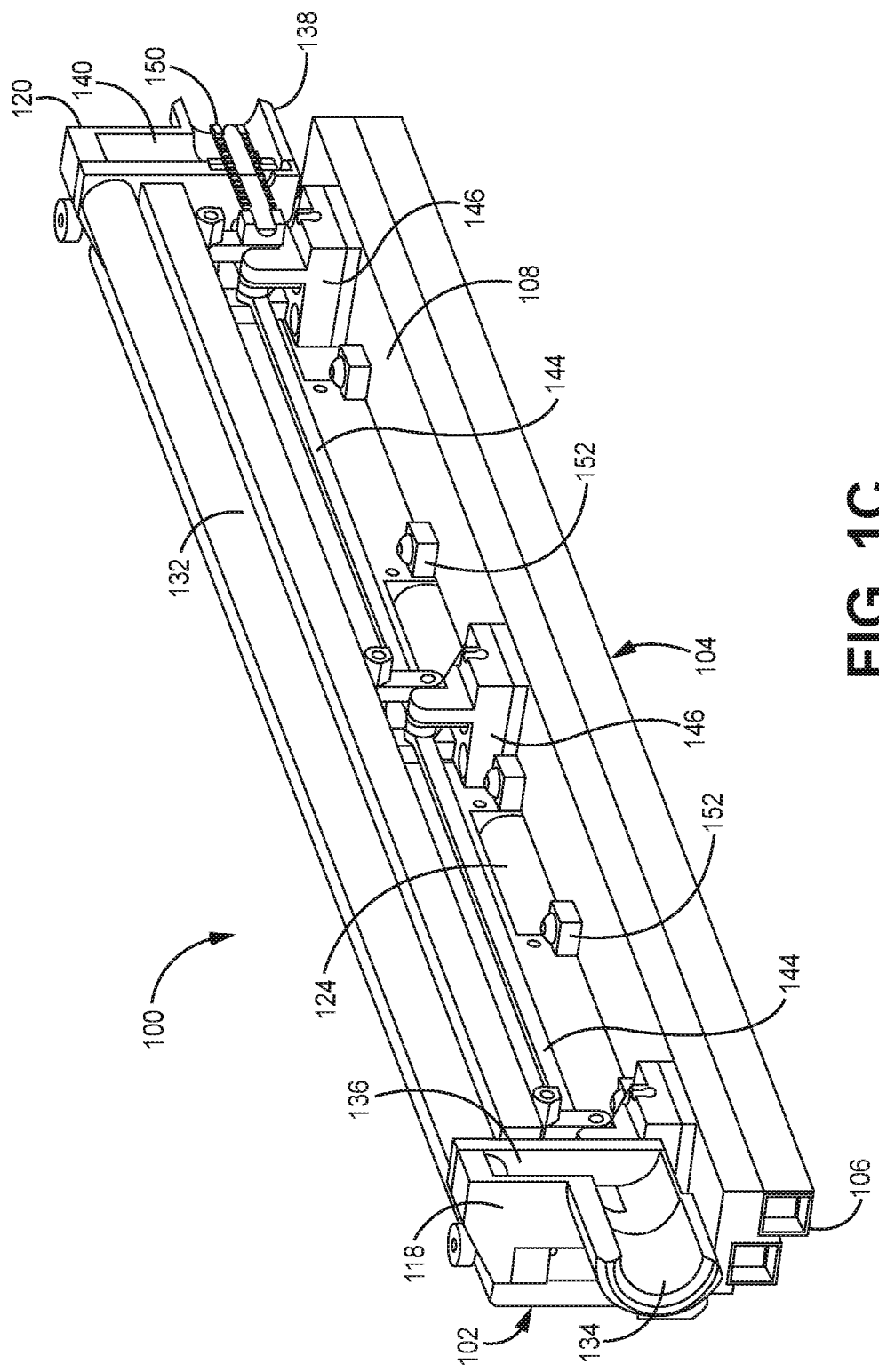
FIG. 1C is a cross-sectional side perspective view of the magnet bar assembly of FIG. 1A, in a deployed position.

A pair of rigid coolant tubes 130, 132 are each connected between end plates 110, 112 and above top plate 114. A strain relieved end block connection 134 is coupled to end plate 118, and a strain relieved end cap connection 138 is coupled to end plate 120. As shown in FIGS. 1B and 1C, coolant tubes 130, 132 communicate with end block connection 134 through a passage 136 in end plate 118. In addition, coolant tubes 130, 132 communicate with end cap connection 138 through a passage 140 in end plate 120.

The strain relief for end block connection 134 and end cap connection 138 is provided by end plates 118 and 120, which are able to move up and down along bolts 122 during operation of the rotary target cathode. This configuration allows end block connection 134, end cap connection 138, and coolant tubes 130, 132 to move together with end plates 118 and 120. This allows the stress of the magnetic force between the target cylinder and magnets to not be transferred to a central utility shaft on an end block or end cap bushing of the rotary target cathode. Instead, the magnetic force is transferred from the magnets to support structure 102 and then through rollers 124 and into the target cylinder.

Figure 1D:
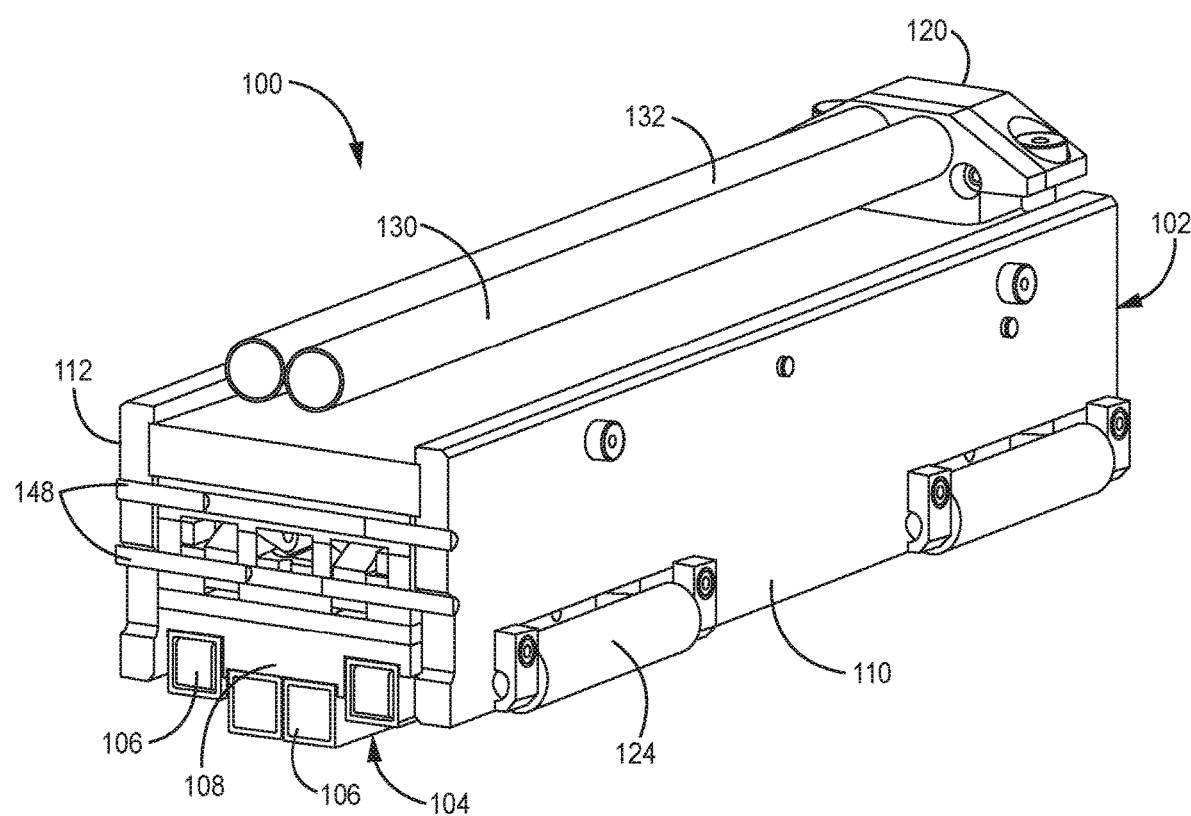
FIG. 1D is a cross-sectional end perspective view of the magnet bar assembly of FIG. 1A, in the retracted position, taken along line 1E-1E of FIG. 1A.
Figure 1E:
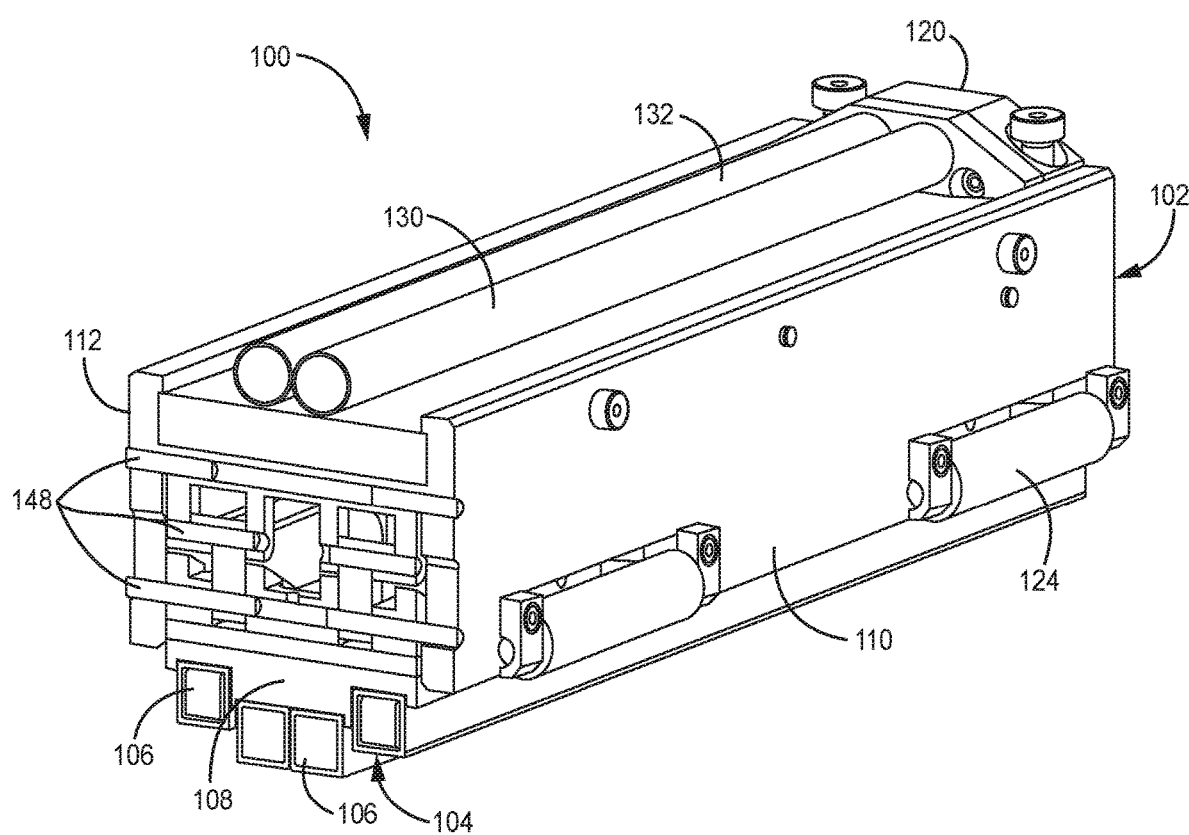
FIG. 1E is a cross-sectional end perspective view of the magnet bar assembly of FIG. 1A, in the deployed position, taken along line 1E-1E of FIG. 1A.

The positioning mechanism of magnet bar assembly 100 includes a mechanical linkage assembly coupled to support structure 102 and magnet bar structure 104. The mechanical linkage assembly comprises a set of linkage coupling bars 144 movably connected between a set of positioning linkage members 146 on magnet bar structure 104 (FIGS. 1B and 1C) and a set of linkage pins 148 coupled with support structure 102 (FIGS. 1D and 1E). A positioning screw 150 is movably coupled to the mechanical linkage assembly to change the position of magnet bar structure 104 between the retracted and deployed positions. A plurality of magnet bar twist limiters 152 (FIGS. 1B and 1C) are coupled to yoke 108 of magnet bar structure 104 to prevent lateral motion of the magnet bar structure 104 during operation of the rotary target cathode.

FIGS. 2A-2E illustrate various views of a magnet bar assembly 200 for a rotary target cathode, according to another embodiment. In general, magnet bar assembly 200 includes a rigid elongated support structure 202, and a magnet bar structure 204 movably attached to support structure 202. The magnet bar structure 204 includes an array of substantially parallel rows of magnets 206 attached to a yoke 208. The magnet bar structure 204 is movable between a retracted position (FIGS. 2B and 2D) and a deployed position (FIGS. 2C and 2E) using a positioning mechanism described hereafter. The positioning mechanism is configured to move magnet bar structure 204 relative to an inner surface of a rotatable target cylinder, such that magnet bar structure 204 is movable between the retracted position and the deployed position.

The support structure 202 includes a pair of opposing side plates 210, 212 and a support block 214 coupled between side plates 210, 212, such as with a set of fasteners 216. A pair of opposing end plates 218, 220 are each movably coupled between side plates 210, 212, such as with a set of bolts 222 located in respective slots 223. A plurality of rollers 224 are movably connected to side plates 210, 212, to hold magnet bar structure 204 off of an inner surface of the target cylinder.

A strain relieved end block connection 226 is coupled to end plate 218, and a strain relieved end cap connection 228 is coupled to end plate 220. The strain relief for end block connection 226 and end cap connection 228 is provided by end plates 218 and 220, which are able to move up and down along slot 223 with bolts 222 during operation of the rotary target cathode.

Figure 2A:
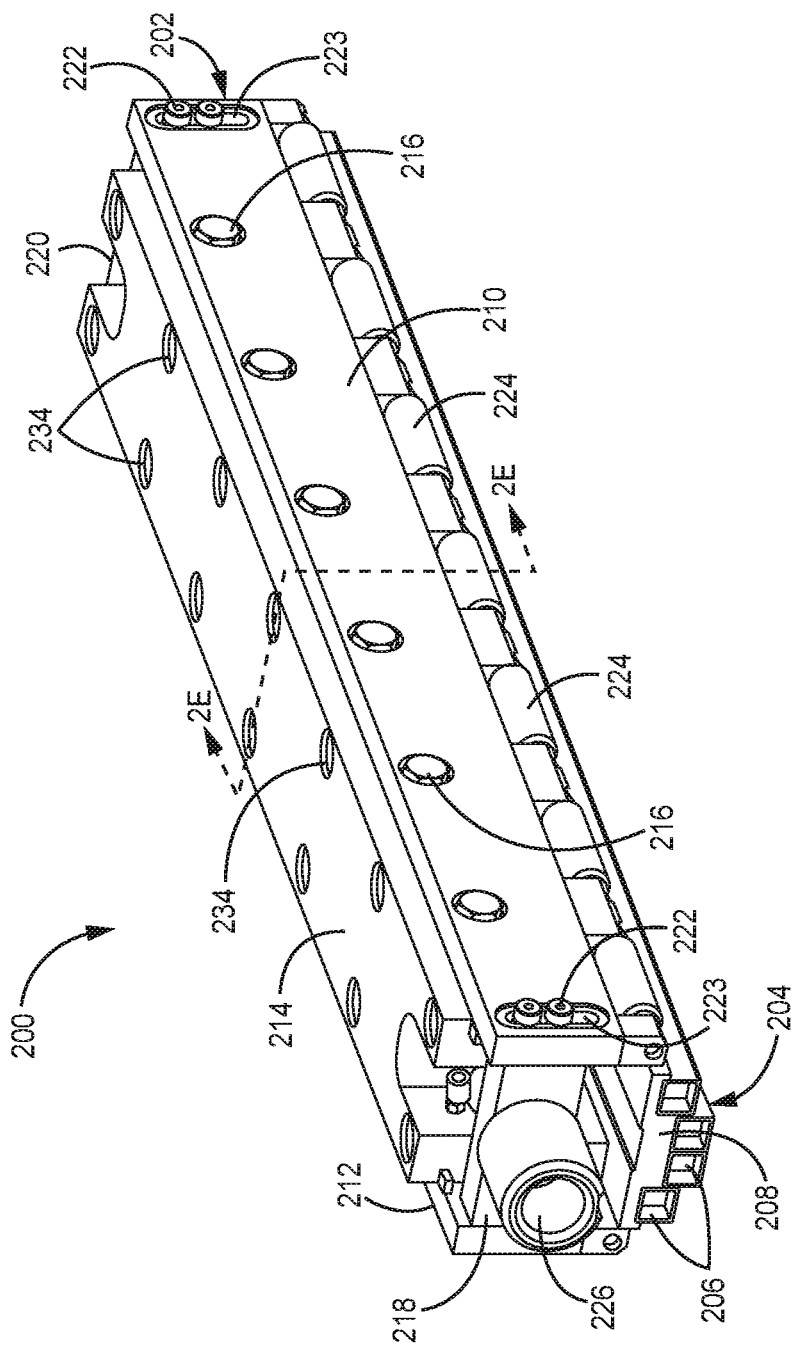
FIG. 2A is a perspective view of a magnet bar assembly for a rotary target cathode, according to another embodiment.
Figure 2B:
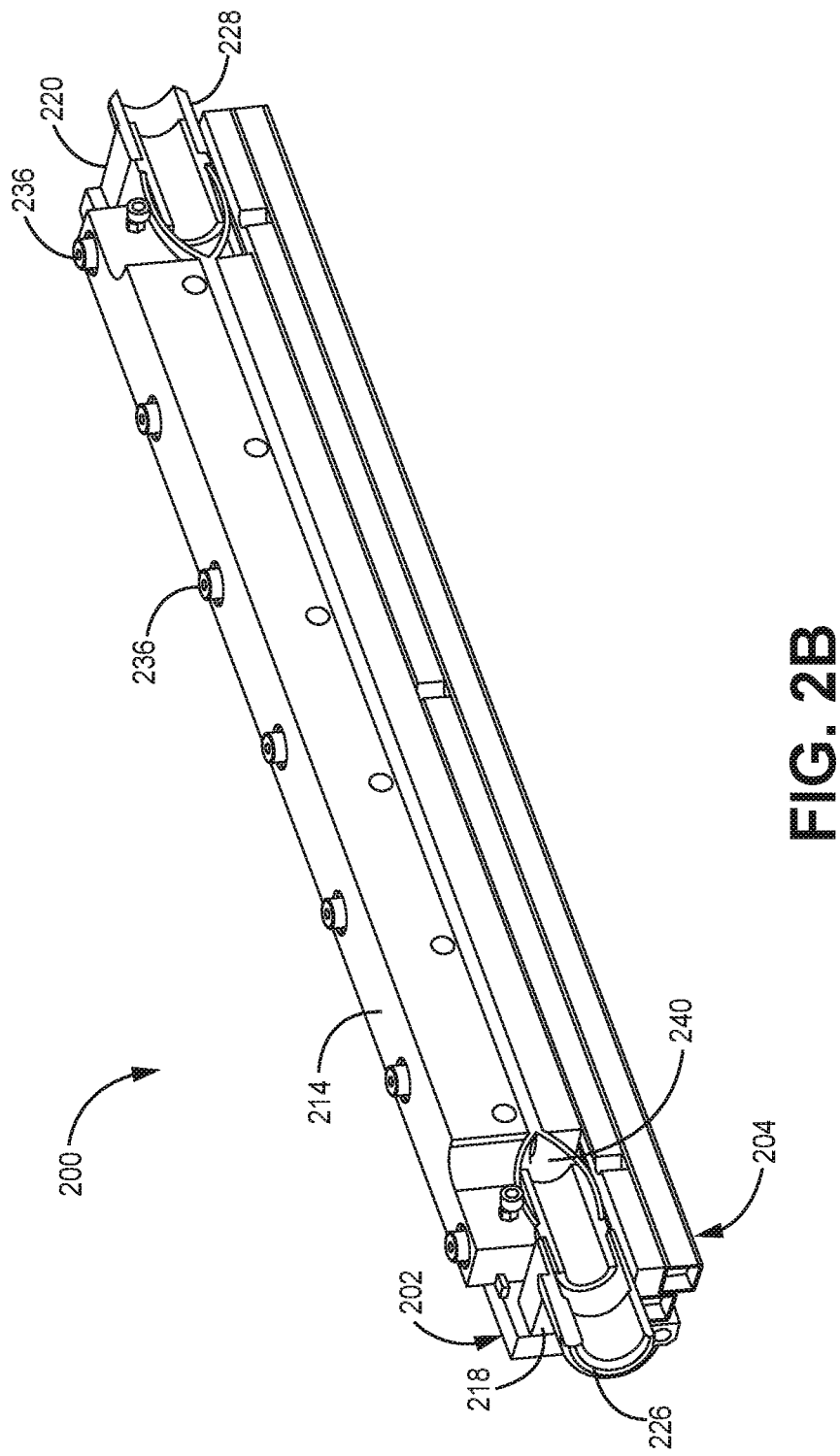
FIG. 2B is a cross-sectional side perspective view of the magnet bar assembly of FIG. 2A, in a retracted position.
Figure 2C:
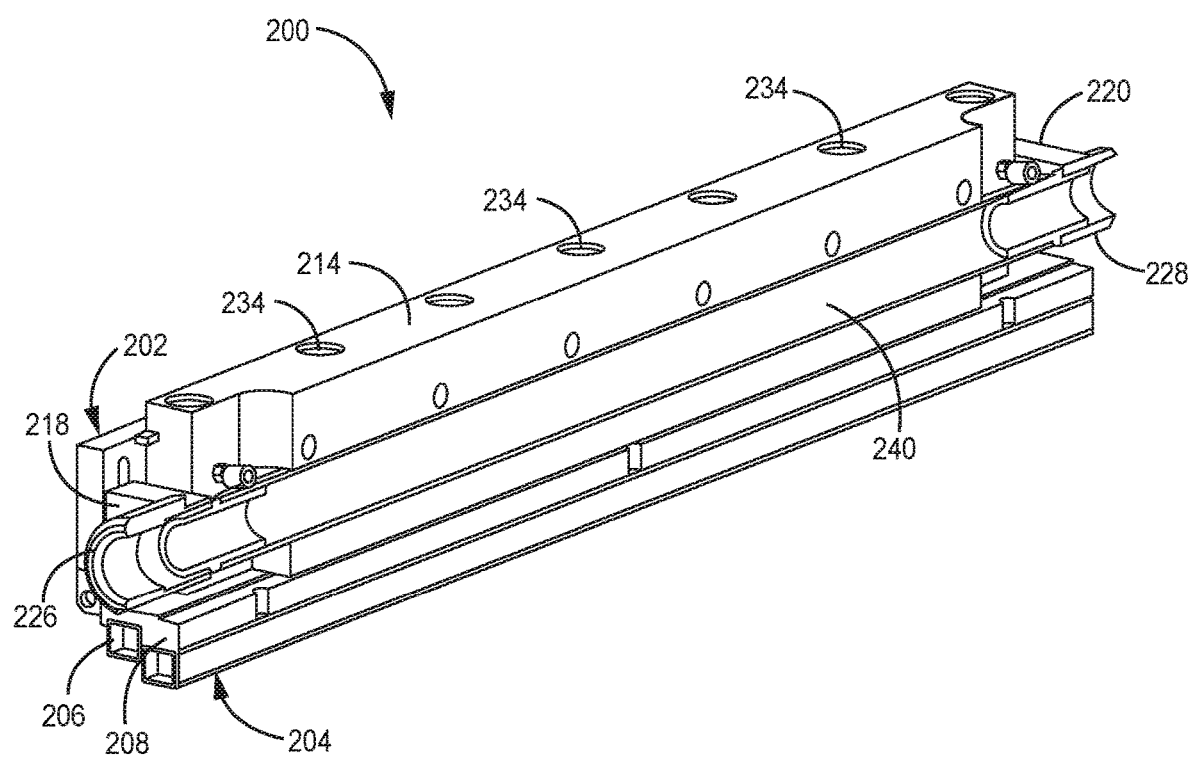
FIG. 2C is a cross-sectional side perspective view of the magnet bar assembly of FIG. 2A, in a deployed position.

The positioning mechanism includes a spring and bladder assembly coupled to support structure 202 and magnet bar structure 204. The spring and bladder assembly comprises a set of compression springs 232 located in a plurality of vertical channels 234 in support block 214. A set of actuation bolts 236 extend through each of vertical channels 234 and engage with springs 232 while also being coupled to magnet bar structure 204. The spring and bladder assembly also includes a flexible coolant tube 240 that also functions as an inflatable bladder. The flexible coolant tube 240 is coupled between end block connection 226 and end cap connection 228 below support block 214 (FIGS. 2B and 2C).

Figure 2D:
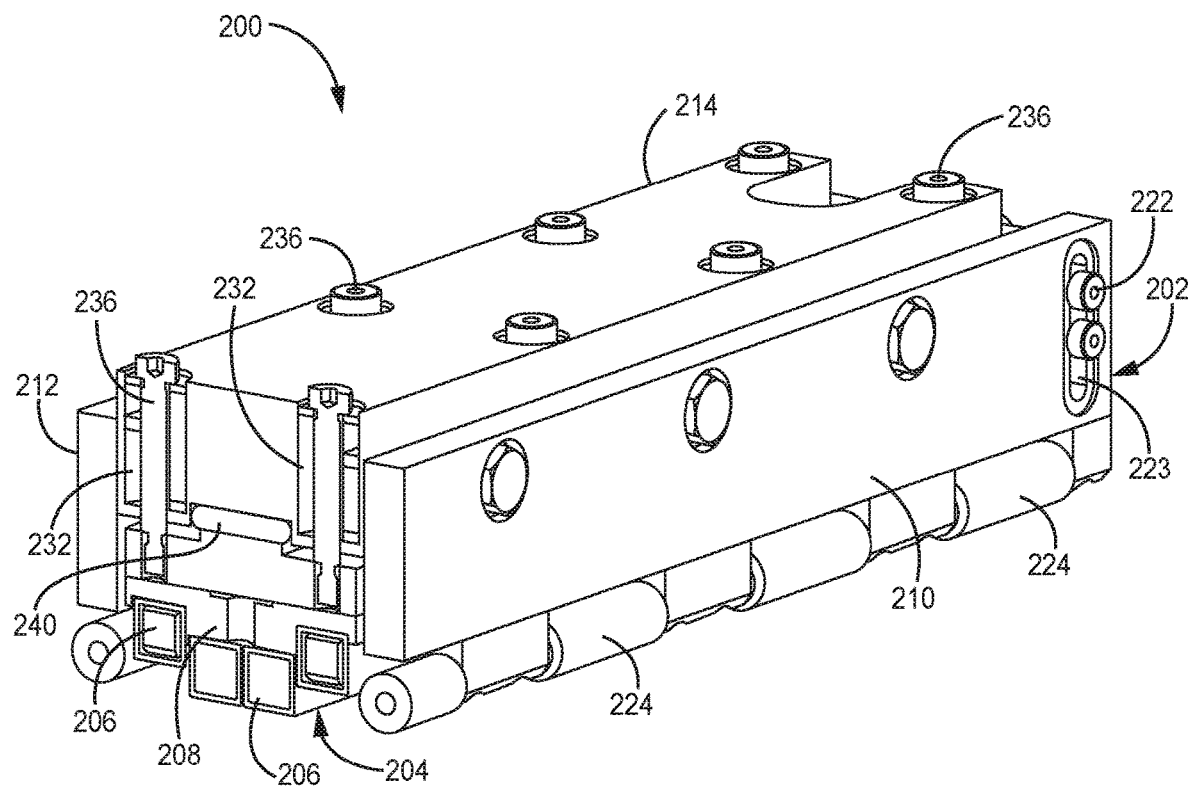
FIG. 2D is a cross-sectional end perspective view of the magnet bar assembly of FIG. 2A, in the retracted position, taken along line 2E-2E of FIG. 2A.
Figure 2E:
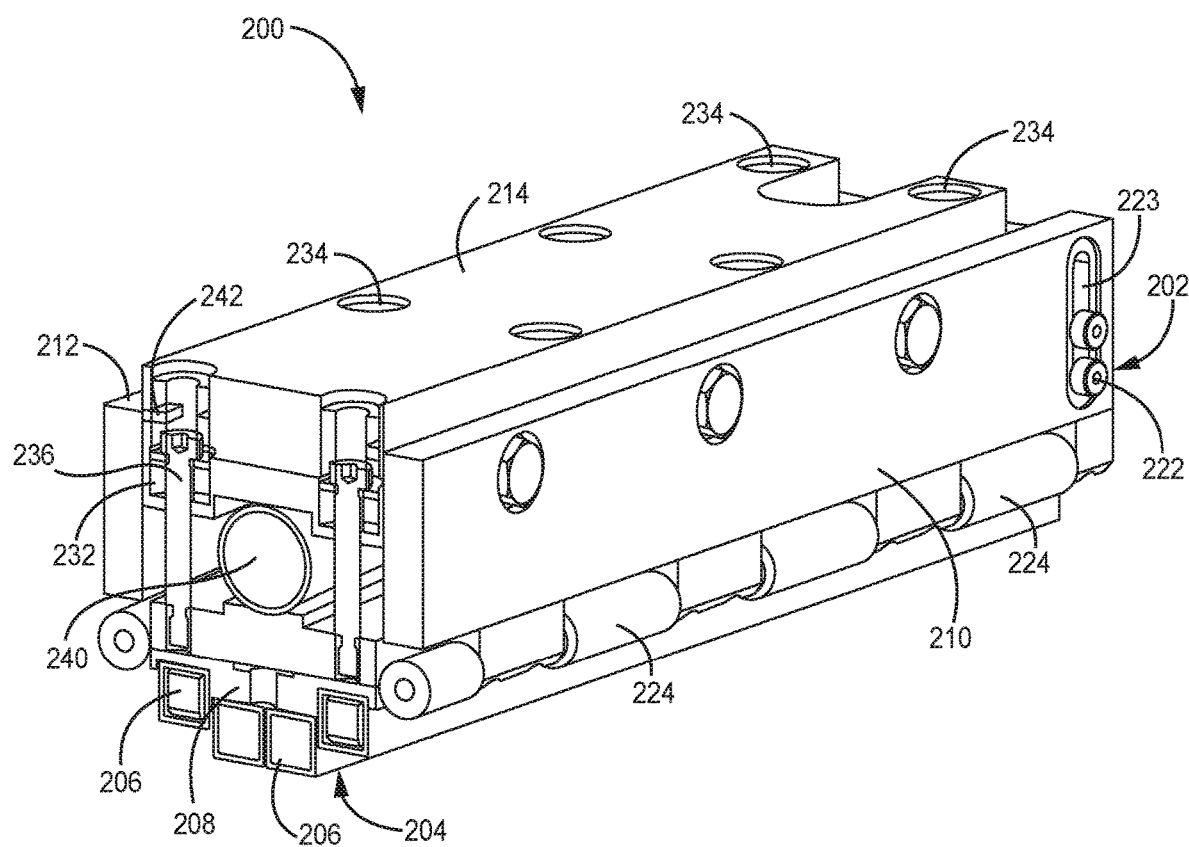
FIG. 2E is a cross-sectional end perspective view of the magnet bar assembly of FIG. 2A, in the deployed position, taken along line 2E-2E of FIG. 2A.

When flexible coolant tube 240 is open at both ends, compression springs 232 are biased to pull bolts 236 and magnet bar structure 204 upward into the retracted position. (FIGS. 2B and 2D). When flexible coolant tube 240 is closed at both ends and pressurized, magnet bar structure 204 is pushed downward away from support structure 202 into the deployed position. (FIGS. 2C and 2E).

While in the deployed position, with springs 232 being compressed, a position locking mechanism coupled to support structure 202 can be engaged to hold springs 232 in the deployed position, allowing flexible coolant tube 240 to be depressurized and opened at both ends. For example, the position locking mechanism can include a set of deployment locking bars 242, which can be slid over bolts 236 to lock springs 232 in place. While magnet bar structure 204 is in the deployed position with the ends of flexible coolant tube 242 being open, flexible coolant tube 242 can function as a coolant supply or return pathway. The position locking mechanism can be disengaged to allow springs 232 to move magnet bar structure 204 back to the retracted position when needed.

The spring and bladder assembly provides a fail-safe operation, in that if flexible coolant tube 240 fails while in a pressurized state, the stored energy from springs 232 will be released, which will automatically pull bolts 236 and magnet bar structure 204 back into the retracted position.

In addition, a deployed distance between magnet bar structure 204 and springs 232 is adjustable by threading bolts 236 in and out of magnet bar structure 204. This allows adjustments along the length of magnet bar structure 204 to provide for tuning of the magnetic field uniformity on a surface of the target cylinder.

FIGS. 3A-3E illustrate various views of a magnet bar assembly 300 for a rotary target cathode, according to a further embodiment. In general, magnet bar assembly 300 includes a rigid elongated support structure 302, and a magnet bar structure 304 movably attached to support structure 302. The magnet bar structure 304 includes an array of substantially parallel rows of magnets 306 attached to a yoke 308. The magnet bar structure 304 is movable between a retracted position (FIGS. 3B and 3D) and a deployed position (FIGS. 3C and 3E) using a positioning mechanism described hereafter. The positioning mechanism is configured to move magnet bar structure 304 relative to an inner surface of a rotatable target cylinder, such that magnet bar structure 304 is movable between the retracted position and the deployed position.

The support structure 302 includes a plurality of support plates 310 in a sandwiched configuration, which are held together with a set of support structure screws 312. The support plates 310 define an internal coolant passage 314 that extends through support structure 302. A pair of opposing end plates 316, 318 are respectively coupled to each end of support plates 310, such as with a set of screws 320. A plurality of rollers 322 are movably connected to support plates 310 to hold magnet bar structure 304 off of an inner surface of the target cylinder.

A strain relieved end block connection 324 with a loose clearance is coupled to end plate 316, and a strain relieved end cap connection 326 with a loose clearance is coupled to end plate 318. The loose clearance at each of connections 324, 326 can be provided by a rubber centering o-ring 328, for example.

Figure 3A:
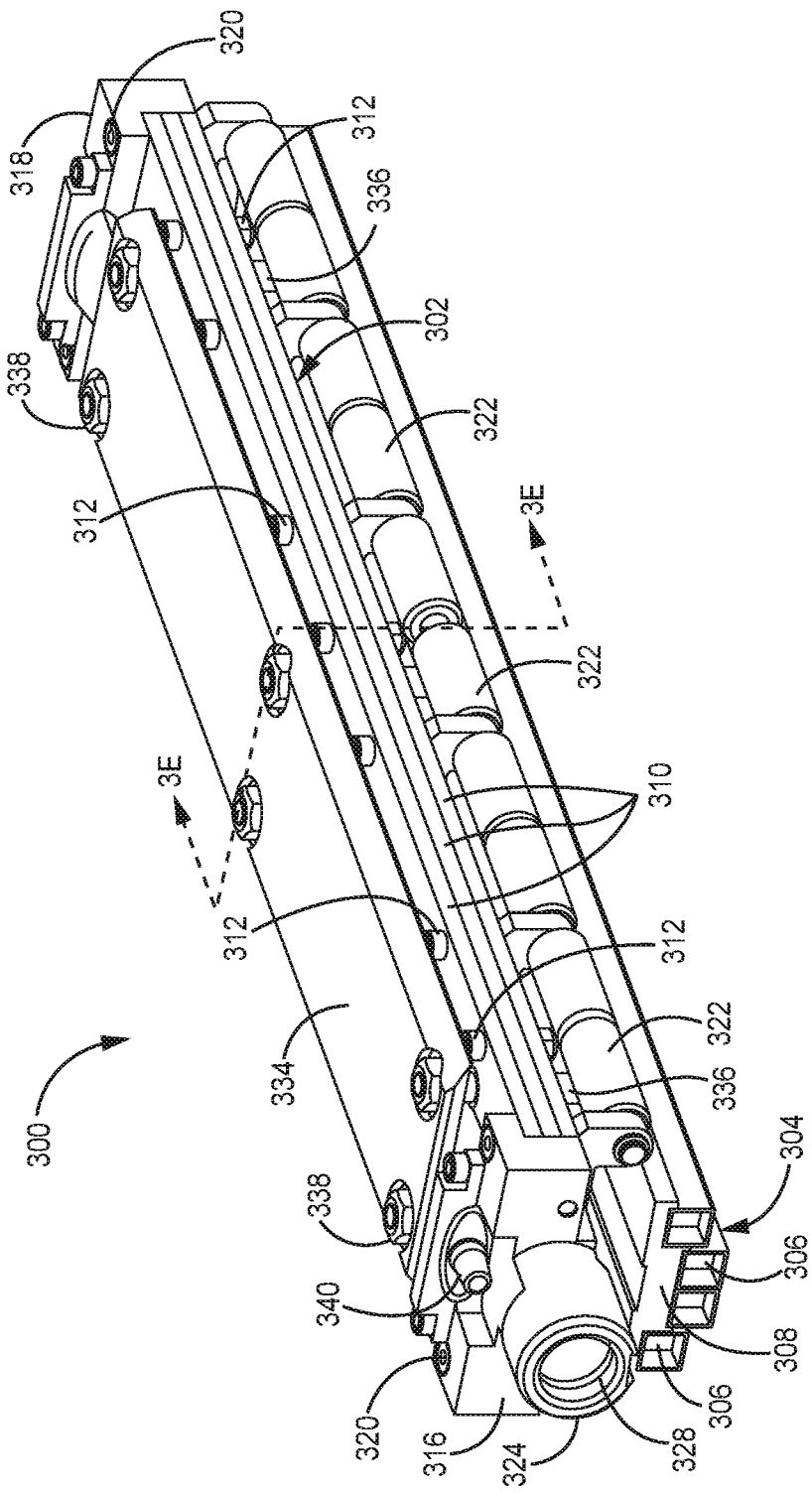
FIG. 3A is a perspective view of a magnet bar assembly for a rotatable target cathode, according to a further embodiment.
Figure 3B:
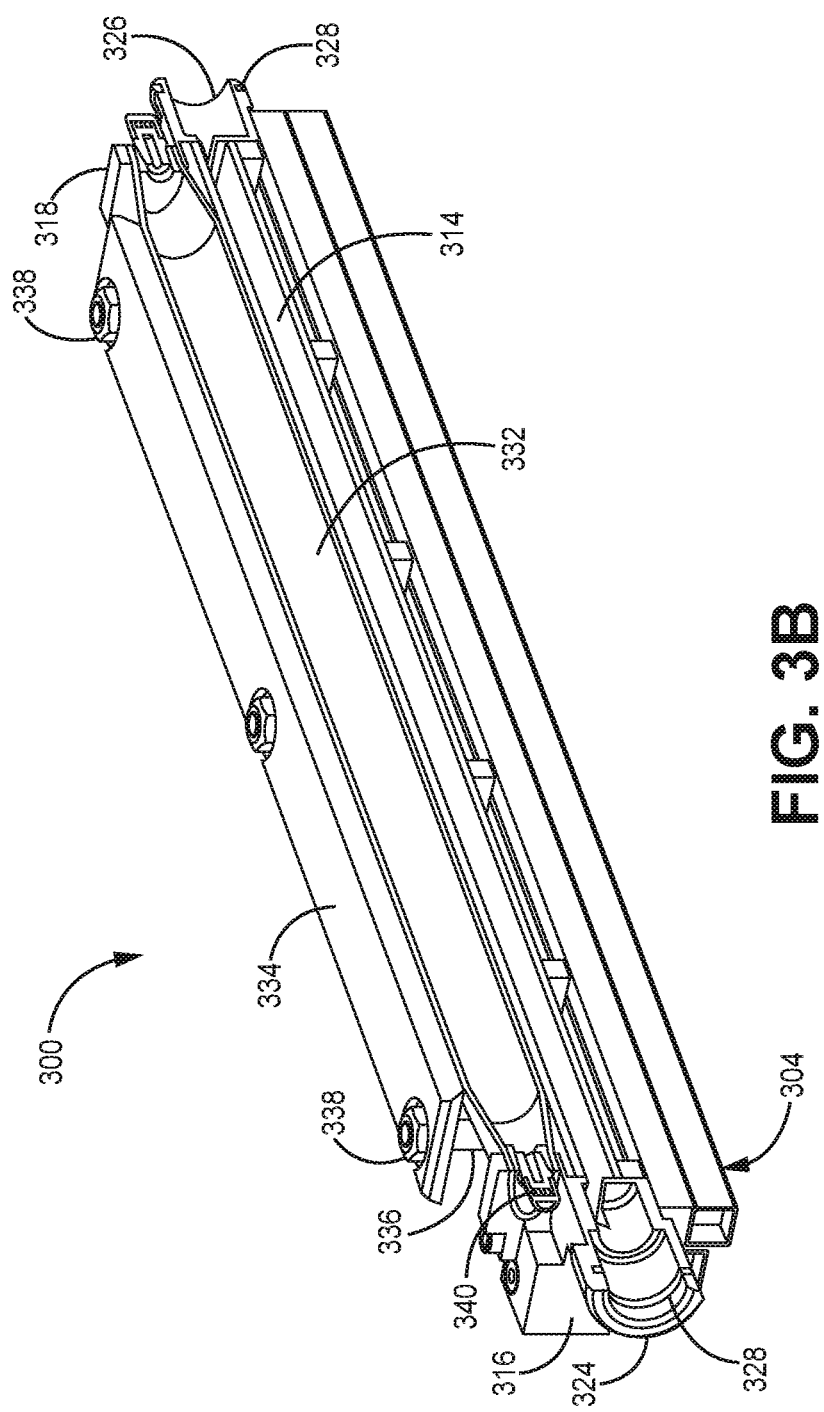
FIG. 3B is a cross-sectional side perspective view of the magnet bar assembly of FIG. 3A, in a retracted position.
Figure 3D:
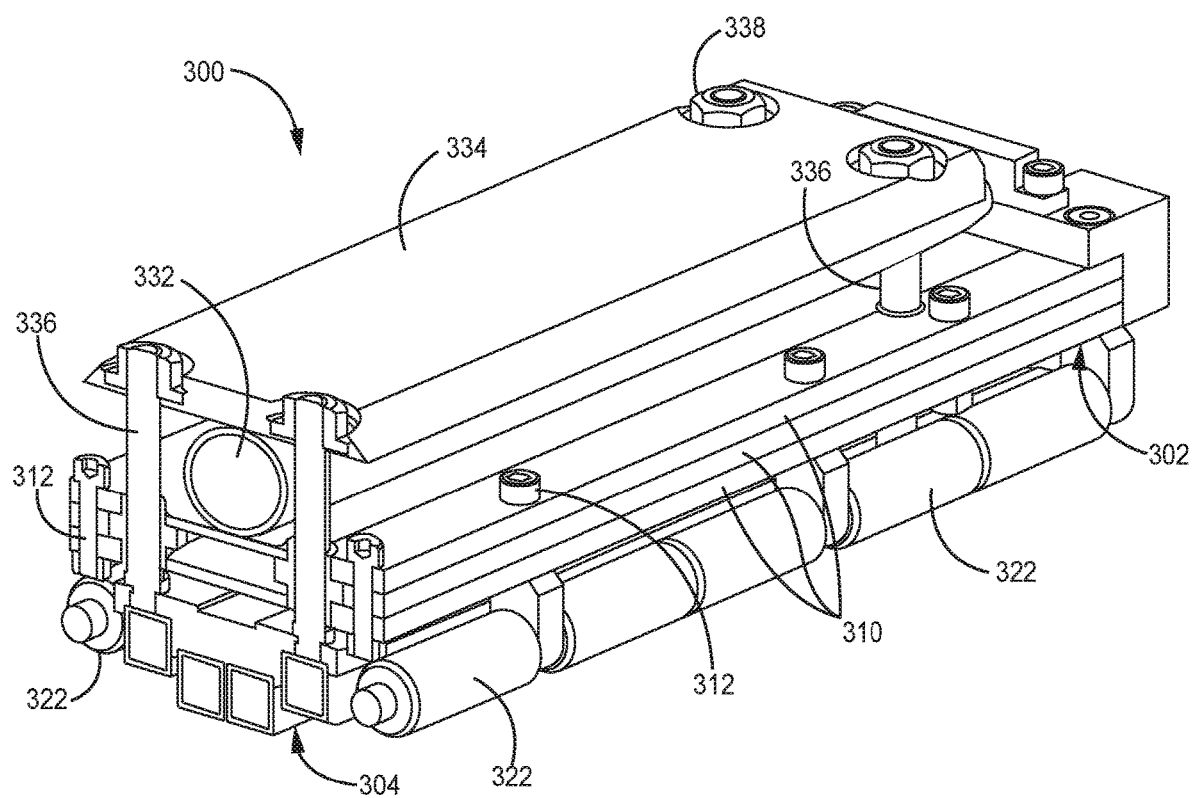
FIG. 3D is a cross-sectional end perspective view of the magnet bar assembly of FIG. 3A, in the retracted position taken, along line 3E-3E of FIG. 3A.
Figure 3E:
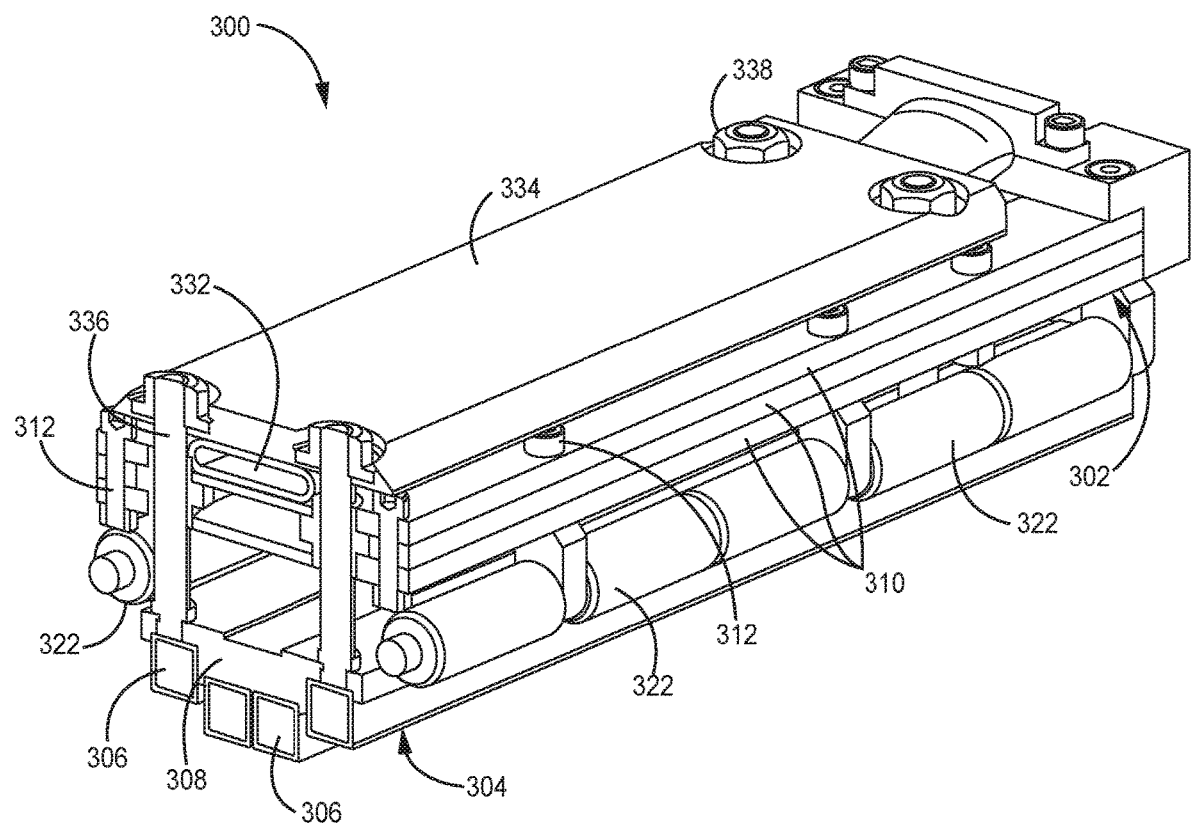
FIG. 3E is a cross-sectional end perspective view of the magnet bar assembly of FIG. 3A, in the deployed position, taken along line 3E-3E of FIG. 3A.

The positioning mechanism includes a bladder assembly coupled to support structure 302 and magnet bar structure 304. The bladder assembly comprises a retraction bladder 332 positioned over support plates 310, and a magnet bar actuation plate 334 located over retraction bladder 332. The magnet bar actuation plate 334 is coupled to yoke 308 of magnet bar structure 304 by a plurality of bolts 336 that pass through support plates 310. A set of magnet bar uniformity adjustment nuts 338, each coupled to a respective one of bolts 336, hold magnet bar actuation plate 334 in place over retraction bladder 332, and allow adjustments along the length of magnet bar structure 304 to tune the magnetic field uniformity on a surface of the target cylinder. A bladder fill port 340 is coupled to retraction bladder 332 to provide a gas from a gas source in order to expand retraction bladder 332. The support structure screws 312 limit the deployment motion of magnet bar actuation plate 334, as shown in FIG. 3E.

When inflated, retraction bladder 332 pushes up magnet bar actuation plate 334, which in turn pulls bolts 336 and magnet bar structure 304 upward into the retracted position. (FIGS. 3B and 3D). When retraction bladder 332 is deflated, magnet bar actuation plate 334 pushes bolts 336 and magnet bar structure 304 downward into the deployed position. (FIGS. 3C and 3E).

Example Embodiments

Example 1 includes a magnet bar assembly for a rotary target cathode, the magnet bar assembly comprising: a support structure; a magnet bar structure movably attached to the support structure, the magnet bar structure including a plurality of magnets; and a positioning mechanism operatively coupled to the support structure and the magnet bar structure, the positioning mechanism configured to move the magnet bar structure between a retracted position and a deployed position; wherein the retracted position of the magnet bar structure substantially reduces a magnetic force between the magnets and a magnetic target material of a target cylinder when the magnet bar assembly is inserted into the target cylinder or removed from the target cylinder; wherein the deployed position of the magnet bar structure substantially increases the magnetic force between the magnets and the magnetic target material when the magnet bar assembly is in the target cylinder, and allows a magnetic field from the magnet bar structure to penetrate through the magnetic target material.

Example 2 includes the magnet bar assembly of Example 1, further comprising a plurality of rollers movably connected to the support structure, the rollers configured to hold the magnet bar structure away from an inner surface of the target cylinder.

Example 3 includes the magnet bar assembly of any of Examples 1-2, further comprising a magnetic force strain relief assembly.

Example 4 includes the magnet bar assembly of Example 3, wherein the magnetic force strain relief assembly comprises a strain relieved end block connection coupled to the support structure at a first end; and a strain relieved end cap connection coupled to the support structure at a second end opposite from the first end; wherein the strain relief assembly prevents the magnetic force between the magnet bar assembly and the magnetic target cylinder from transferring to the end block connection and the end cap connection.

Example 5 includes the magnet bar assembly of any of Examples 1-4, wherein the support structure is substantially rigid to accurately limit a distance between the magnet bar structure and the target cylinder when in the deployed position.

Example 6 includes the magnet bar assembly of any of Examples 1-5, further comprising a coolant pathway to allow a coolant supply and return to be located on only one side of the target cylinder.

Example 7 includes the magnet bar assembly of any of Examples 1-6, further comprising one or more adjustment mechanisms configured to provide individual adjustments along a length of the support structure, while the magnet bar assembly is outside of the target cylinder, to provide for tuning of magnetic field uniformity on a surface of the target cylinder.

Example 8 includes the magnet bar assembly of any of Examples 1-7, wherein the positioning mechanism is actuated using one or more of mechanical, electrical, pneumatic, hydraulic, or magnetic force mechanisms.

Example 9 includes the magnet bar assembly of any of Examples 1-8, wherein the positioning mechanism comprises a mechanical linkage assembly coupled to the support structure and the magnet bar structure.

Example 10 includes the magnet bar assembly of Example 9, further comprising a positioning screw movably coupled to the mechanical linkage assembly to change the position of the magnet bar structure between the retracted position and the deployed position.

Example 11 includes the magnet bar assembly of any of Examples 1-8, wherein the positioning mechanism comprises a spring and inflatable bladder assembly coupled to the support structure and the magnet bar structure.

Example 12 includes the magnet bar assembly of Example 11, wherein the spring and inflatable bladder assembly comprises a set of compression springs coupled to the support structure and magnet bar structure; a set of actuation bolts coupled to the magnet bar structure that extend through the support structure and the compression springs, and engage with the compression springs; and a flexible coolant tube comprising an inflatable bladder, which is coupled between the support structure and the magnet bar structure.

Example 13 includes the magnet bar assembly of Example 12, wherein a deployed distance between the magnet bar structure and the compression springs is adjustable by threading the actuation bolts in and out of the magnet bar structure, to allow adjustments along a length of the magnet bar structure to provide for tuning of magnetic field uniformity on a surface of the target cylinder.

Example 14 includes the magnet bar assembly of any of Examples 12-13, wherein when the flexible coolant tube is open at both ends, the compression springs are biased to pull the actuation bolts and the magnet bar structure into the retracted position; and when the flexible coolant tube is closed at both ends and pressurized, the magnet bar structure is pushed away from the support structure into the deployed position.

Example 15 includes the magnet bar assembly of Example 14, wherein when the magnet bar structure is moved into the deployed position by the pressurized flexible coolant tube, a position locking mechanism coupled to the support structure can be engaged to hold the compression springs in the deployed position, allowing the flexible coolant tube to be depressurized and opened at both ends; when the magnet bar structure is in the deployed position and the flexible coolant tube ends are open, the coolant tube functions as a coolant supply or return pathway; and when the magnet bar structure is in the deployed position, the position locking mechanism can be disengaged to move the magnet bar structure back to the retracted position.

Example 16 includes the magnet bar assembly of any of Examples 1-8, wherein the positioning mechanism comprises a bladder assembly coupled to the support structure and the magnet bar structure.

Example 17 includes the magnet bar assembly of Example 16, wherein the bladder assembly comprises a retraction bladder positioned on a side of the support structure opposite from the magnet bar structure; and a magnet bar actuation plate located to sandwich the retraction bladder between the magnet bar actuation plate and the support structure, the magnet bar actuation plate coupled to the magnet bar structure by a plurality of bolts that pass through the support structure.

Example 18 includes the magnet bar assembly of Example 17, wherein when inflated, the retraction bladder pushes the magnet bar actuation plate, which in turn pulls the bolts and the magnet bar structure into the retracted position; and when the retraction bladder is deflated, the magnet bar actuation plate pushes the bolts and the magnet bar structure into the deployed position.

Example 19 includes the magnet bar assembly of any of Examples 17-18, further comprising a set of magnet bar uniformity adjustment nuts, each coupled to a respective one of the bolts, to allow adjustments along a length of the magnet bar structure to provide for tuning of magnetic field uniformity on a surface of the target cylinder.

Example 20 includes a magnet bar assembly for a rotary target cathode, the magnet bar assembly comprising: a support structure; a magnet bar structure attached to the support structure, the magnet bar structure including a plurality of magnets; and a magnetic force strain relief assembly comprising a strain relieved end block connection coupled to the support structure at a first end, and a strain relieved end cap connection coupled to the support structure at a second end opposite from the first end; wherein the strain relief assembly prevents the magnetic force between the magnet bar assembly and a magnetic target cylinder from transferring to the end block connection and the end cap connection.

While a number of embodiments have been described, it will be understood that the described embodiments are to be considered only as illustrative and not restrictive, and that various modifications to the described embodiments may be made without departing from the scope of the invention. The scope of the invention is therefore indicated by the appended claims rather than by the foregoing description. All changes that come within the meaning and range of equivalency of the claims are to be embraced within their scope.

What is claimed is:

1. A magnet bar assembly for a rotary target cathode, the magnet bar assembly comprising:
    a support structure;
    a magnet bar structure movably attached to the support structure, the magnet bar structure including a plurality of magnets; and
    a positioning mechanism operatively coupled to the support structure and the magnet bar structure, the positioning mechanism configured to move the magnet bar structure between a retracted position and a deployed position, the positioning mechanism comprising a spring and inflatable bladder assembly coupled to the support structure and the magnet bar structure, wherein the spring and inflatable bladder assembly comprises:
        a set of compression springs coupled to the support structure and magnet bar structure;
        a set of actuation bolts coupled to the magnet bar structure that extend through the support structure and the compression springs, and engage with the compression springs; and
        a flexible coolant tube comprising an inflatable bladder, which is coupled between the support structure and the magnet bar structure;
    wherein the retracted position of the magnet bar structure substantially reduces a magnetic force between the magnets and a magnetic target material of a target cylinder when the magnet bar assembly is inserted into the target cylinder or removed from the target cylinder;
    wherein the deployed position of the magnet bar structure substantially increases the magnetic force between the magnets and the magnetic target material when the magnet bar assembly is in the target cylinder, and allows a magnetic field from the magnet bar structure to penetrate through the magnetic target material.

2. The magnet bar assembly of claim 1, further comprising a plurality of rollers movably connected to the support structure, the rollers configured to hold the magnet bar structure away from an inner surface of the target cylinder.

3. The magnet bar assembly of claim 1, further comprising a magnetic force strain relief assembly.

4. The magnet bar assembly of claim 3, wherein the magnetic force strain relief assembly comprises:
    a strain relieved end block connection coupled to the support structure at a first end; and
    a strain relieved end cap connection coupled to the support structure at a second end opposite from the first end;
    wherein the strain relief assembly prevents the magnetic force between the magnet bar assembly and the magnetic target cylinder from transferring to the end block connection and the end cap connection.

5. The magnet bar assembly of claim 1, wherein the support structure is substantially rigid to limit a distance between the magnet bar structure and the target cylinder when in the deployed position.

6. The magnet bar assembly of claim 1, wherein the flexible coolant tube provides a coolant pathway to allow a coolant supply and return to be located on only one side of the target cylinder.

7. The magnet bar assembly of claim 1, further comprising one or more adjustment mechanisms configured to provide individual adjustments along a length of the support structure, while the magnet bar assembly is outside of the target cylinder, to provide for tuning of magnetic field uniformity on a surface of the target cylinder.

8. The magnet bar assembly of claim 1, wherein a deployed distance between the magnet bar structure and the compression springs is adjustable by threading the actuation bolts in and out of the magnet bar structure, to allow adjustments along a length of the magnet bar structure to provide for tuning of magnetic field uniformity on a surface of the target cylinder.

9. The magnet bar assembly of claim 1, wherein:
    when the flexible coolant tube is open at both ends, the compression springs are biased to pull the actuation bolts and the magnet bar structure into the retracted position; and
    when the flexible coolant tube is closed at both ends and pressurized, the magnet bar structure is pushed away from the support structure into the deployed position.

10. The magnet bar assembly of claim 9, wherein:
    when the magnet bar structure is moved into the deployed position by the pressurized flexible coolant tube, a position locking mechanism coupled to the support structure can be engaged to hold the compression springs in the deployed position, allowing the flexible coolant tube to be depressurized and opened at both ends;
    when the magnet bar structure is in the deployed position and the flexible coolant tube ends are open, the coolant tube functions as a coolant supply or return pathway; and
    when the magnet bar structure is in the deployed position, the position locking mechanism can be disengaged to move the magnet bar structure back to the retracted position.

* * * * *